US009418945B2

(12) United States Patent
Reuter et al.

(10) Patent No.: US 9,418,945 B2
(45) Date of Patent: Aug. 16, 2016

(54) INTEGRATED CIRCUIT FOR GENERATING OR PROCESSING A RADIO FREQUENCY SIGNAL

(75) Inventors: Ralf Reuter, Munich (DE); Bernhard Dehlink, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/427,036

(22) PCT Filed: Sep. 14, 2012

(86) PCT No.: PCT/IB2012/054808
§ 371 (c)(1),
(2), (4) Date: Mar. 10, 2015

(87) PCT Pub. No.: WO2014/041404
PCT Pub. Date: Mar. 20, 2014

(65) Prior Publication Data
US 2015/0243606 A1    Aug. 27, 2015

(51) Int. Cl.
*H01L 23/552* (2006.01)
*H01P 5/18* (2006.01)
*H01L 23/528* (2006.01)
*H01P 5/02* (2006.01)

(52) U.S. Cl.
CPC ............ *H01L 23/552* (2013.01); *H01L 23/528* (2013.01); *H01P 5/022* (2013.01); *H01P 5/184* (2013.01); *H01P 5/028* (2013.01)

(58) Field of Classification Search
CPC ..... H01L 23/552; H01L 23/528; H01P 5/022; H01P 5/184; H01P 5/028
See application file for complete search history.

(56) References Cited

U.S. PATENT DOCUMENTS

| 5,471,146 | A | 11/1995 | Krayeski et al. |
| 6,370,404 | B1 | 4/2002 | Shen |
| 6,590,473 | B1 | 7/2003 | Seo et al. |
| 7,187,910 | B2 * | 3/2007 | Kim ........................ H01P 5/185 333/109 |
| 7,305,223 | B2 | 12/2007 | Liu et al. |
| 8,035,458 | B2 | 10/2011 | Frye et al. |
| 2009/0146758 | A1 | 6/2009 | Niiranen |
| 2011/0057742 | A1 * | 3/2011 | Frye ........................ H01P 5/10 333/26 |
| 2011/0204992 | A1 | 8/2011 | McIntyre et al. |

OTHER PUBLICATIONS

International Search Report and Written Opinion correlating to PCT/IB2012/054808 dated Mar. 18, 2013.

* cited by examiner

*Primary Examiner* — Fernando L Toledo
*Assistant Examiner* — Neil Prasad
(74) *Attorney, Agent, or Firm* — Charlene R. Jacobsen

(57) ABSTRACT

An integrated circuit includes a signal line for carrying a radio frequency signal; a coupling line inductively coupled to the signal line for delivering an induced signal in dependence on the radio frequency signal; a connecting line connected to a pick-off point of the coupling line for picking off the induced signal from the coupling line; and a conductive part for shielding the coupling line against electromagnetic interference and for enhancing inductive coupling between the signal line and the coupling line. The conductive part may have a uniform flat surface facing the coupling line. The signal line may extend parallel to the surface. The coupling line may extend parallel to the signal line and may be arranged between the surface and the signal line.

20 Claims, 5 Drawing Sheets

INTEGRATED CIRCUIT FOR GENERATING OR PROCESSING A RADIO FREQUENCY SIGNAL

FIELD OF THE INVENTION

This invention relates to an integrated circuit for generating or processing a radio frequency signal.

BACKGROUND OF THE INVENTION

An integrated circuit is a miniaturized electronic device which may unite a large number of functional components in a very small volume. The functional components may include analog as well as digital components. For instance, radio frequency devices for generating or processing a radio frequency signal may be implemented by means of integrated circuit. The integrated circuit may comprise both active and passive electronic components. Active components may be used to control electrical currents or voltages in the circuit. Active components may notably include transistors. Passive components, also referred to as integrated passive devices (IPDs), may include, for instance, resistors, capacitors, inductors, and diodes.

For example, U.S. Pat. No. 7,305,223 B2 (Liu et al.) describes a radio frequency (RF) coupler integrated in an integrated circuit. The RF coupler may, for instance, be used to sense the power level of a RF signal in the integrated circuit.

SUMMARY OF THE INVENTION

The present invention provides an integrated circuit for generating or processing a radio frequency signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
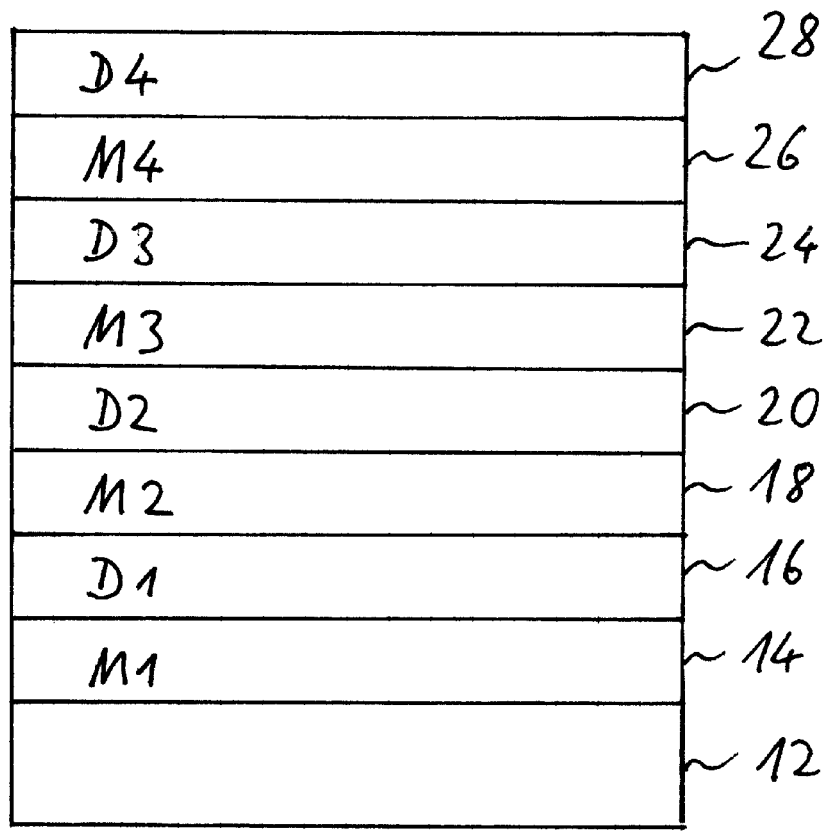
FIG. 1 schematically shows an example of an embodiment of an integrated circuit.

FIG. 1 schematically illustrates an example of an integrated circuit 10. The integrated circuit 10 may, for instance, be arranged for generating or processing a radio frequency signal in, e.g., the megahertz or gigahertz range. The integrated circuit 10 may, for instance, comprise a receiver or a transmitter for processing a received radio frequency signal or for modulating and up-converting a radio frequency signal to be transmitted via, e.g., an antenna. The antenna may be external to the integrated circuit 10. The integrated circuit 10 may notably comprise an oscillator for generating a high frequency signal. The oscillator (not shown) may, for example, have a working frequency in the radar range of, e.g., between 1 gigahertz and 200 gigahertz. A radar frequency commonly used in automotive radar applications is around 77 gigahertz.

In the shown example, the integrated circuit 10 may, for example, comprise a substrate 12 and a set of layers 14, 16, 18, 20, 22, 24, 26, and 28 stacked atop each other on the substrate 12. This stack structure may be viewed as a result of a manufacturing technique in which layers of conductive and nonconductive materials are applied in an alternating manner on the substrate 12. After applying a thin layer of a conductive material, e.g., a metal, on top of the stack, that layer may be patterned to produce microelectrical components such as conduction lines or electrodes. A desired pattern may notably be produced by removing some material from the conductive layer in a controlled manner. The volume occupied before patterning, i.e., before removing material from the layer, may still be referred to as a layer. In this application, a layer does therefore not necessarily refer to a specific physical component of the integrated circuit 10 but may rather refer to a thin planar spatial volume or slice of the integrated circuit 10.

In the shown example, the integrated circuit 10 may comprise a succession of conduction layers M1 to M4 (layers 14, 18, 22, 26) and isolation layers D1 to D4 (layers 16, 20, 24, 28) stacked atop each other. Each conduction layer may comprise a conductive material, e.g., a metal, applied on the preceding layer, i.e., the layer below, which may be the substrate 12 or one of the other layers. Each isolation layer D1 to D4 may comprise or consist of a dielectric material. The conduction layers and isolation layers may also be referred to as metal layers and dielectric layers, respectively. The dielectric layers may serve chiefly for isolating the metal layers from each other. In addition, a dielectric layer may, for instance, serve to form a capacitor in conjunction with its adjoining metal layers. For instance, electrodes formed in, for example, metal layers M3 and M4 may form a capacitor with a capacitance that is enhanced by the dielectrical constant of the dielectrical layer D3. Among the large variety of electrical or electronic components which may be integrated in the integrated circuit 10 may notably be one or more CMOS components. For instance, a CMOS inverter may be provided by components distributed across several layers.

Figure 2:
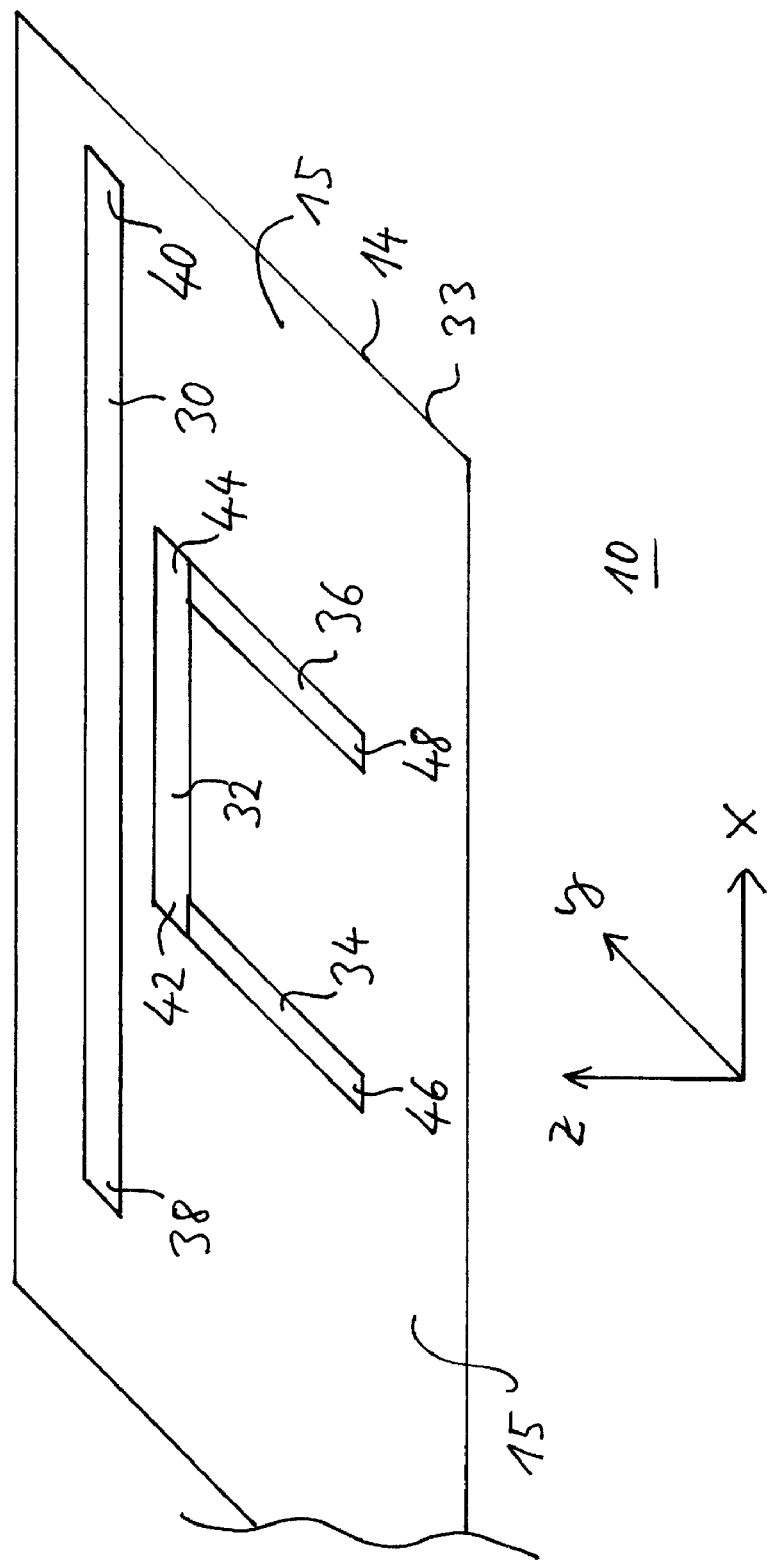
FIG. 2 schematically shows another example of an embodiment of an integrated circuit.
Figure 3:
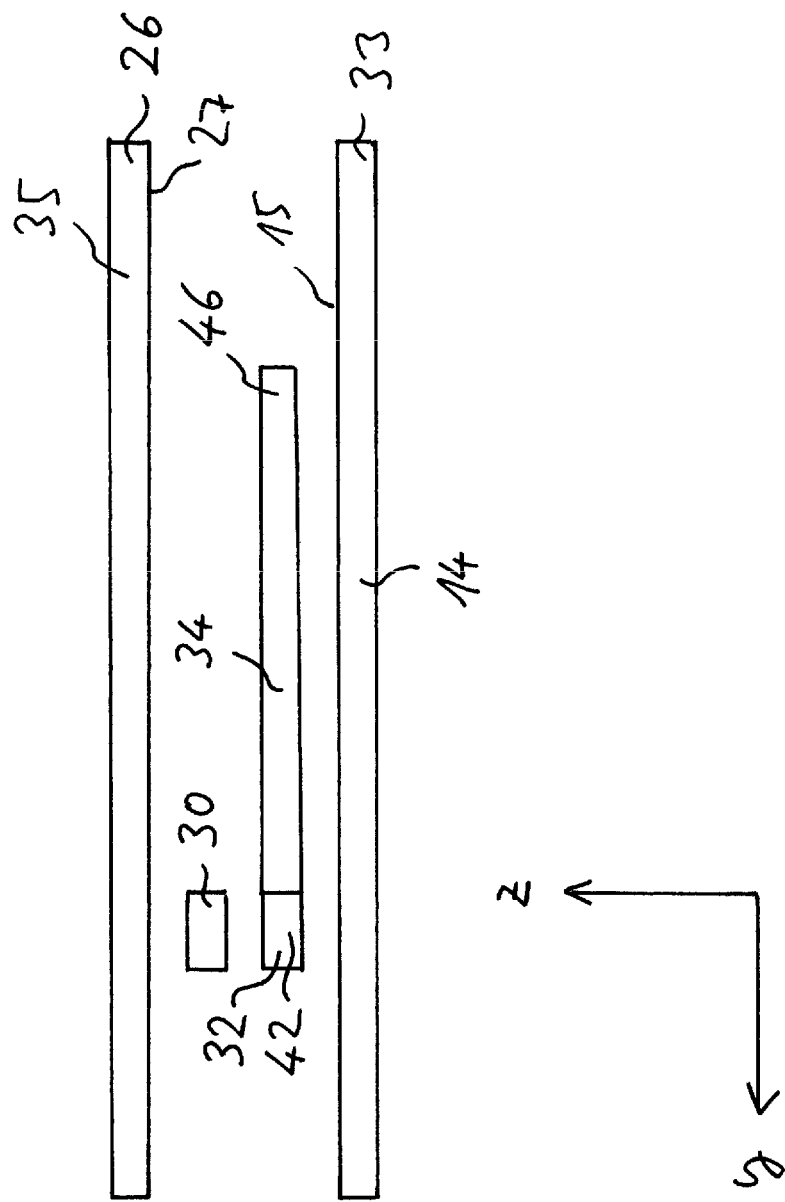
FIG. 3 schematically shows another example of an embodiment of an integrated circuit.

FIG. 2 gives a schematic perspective view of a region in an integrated circuit 10. FIG. 3 gives a corresponding sectional view. The integrated circuit 10 may be the one shown in FIG. 1. In this example, the integrated circuit 10 may notably comprise a signal line 30 for carrying a radio frequency signal. It may further comprise a coupling line 32 inductively coupled to the signal line 30. The coupling line 32 may thus deliver an induced signal in dependence on the radio frequency signal on the signal line 30. The signal line 30 and the coupling line 32 may, for instance, be located in the metal layers 18 and 22 shown in FIG. 1, respectively. The integrated circuit 10 may further comprise a first connecting line 34 connected to a pick-off point 42 of the coupling line 32. It may further comprise a second connecting line 36 connected to a second pick-off point 44 of the coupling line 32. The connecting lines 34, 36 may thus serve to pick-off the induced signal from the coupling line 32 at the first pick-off point 42 and the second pick-off point 44, respectively.

The integrated circuit 10 may further comprise a conductive part 33. The conductive part 33 may shield the coupling line 32 against electromagnetic interference. It may also enhance inductive coupling between the signal line 30 and the coupling line 32. The conductive part 33 may have a surface 15 facing the coupling line 32. The surface 15 may be flat. The surface 15 may furthermore be uniform, i.e., unpatterned. In other words, the conductive part 33 may be void of any pattern for implementing additional components such as connecting lines. The conductive part 33 may thus be dedicated to improving the inductive coupling between the signal line 30 and the coupling line 32.

The signal line 30 may extend parallel to the surface 15. The coupling line 32 may extend parallel to the signal line 30 and be located between the surface 15 and the signal line 30. The signal line 30, the coupling line 32, and the conductive part 33 may be located, for instance, in layers 22, 18, and 14 (see FIG. 1), respectively. However, the design shown in FIG. 2 can also be implemented in an integrated circuit which is not based on layers. The conductive part 33 may be an isolated region within, e.g., the metal layer 14. This region may be fairly large. For instance, it may be larger than the coupling line 32 so that the coupling line 32 may be located entirely above the conductive part 32.

The integrated circuit 10 may further comprise a second conductive part 35 (see FIG. 3). The second conductive part 35 may, for instance, be located in the fourth metal layer 26. The second conductive part 35 may have a surface 27 facing the signal line 30. The signal line 30, or at least part of it, and the coupling line 32 may thus be located between the first conductive part 33 and second conductive part 35. The second conductive part 35 may further improve conductive coupling between the signal line 30 and the coupling line 32 and may further shield these components against electromagnetic perturbations. The second conductive part 35 may be similar to the first conductive part 33. Its surface 27 may notably be flat and uniform. The second conductive part 35 may, for instance, be an unpatterned part of the metal layer 26.

When the device 10 is operated, a radio frequency signal may travel on the signal line 30. The RF signal may, for instance, be injected at a first end 38 and propagate to a second end 40 of the signal line 30. In the shown example, the signal line 30 is straight, but this is not necessarily so. The radio frequency signal may, for instance, have a frequency above one gigahertz. The RF signal propagating along the signal line 30 may induce a corresponding oscillating radio frequency signal in the coupling line 32. The coupling between the signal line 30 and the coupling line 32 may be maximized by minimizing the gap between the two lines while ensuring that they remain isolated from each other. The distance between the signal line 30 and the coupling line 32 may largely depend on the technique used for manufacturing the integrated circuit 10. For instance, when a stack design with metal layers and dielectric layers is used, the distance between the two lines 30 and 32 (see, e.g., FIG. 3) may be the thickness of the dielectric layer (e.g., layer 20 in FIG. 1) that may be located between the two lines. A dielectric layer may, for instance, have a thickness of between 1 micrometer and 10 micrometers. It is pointed out that the drawings in this specification are not to scale.

Numerical studies suggest that the radio frequency signal induced in the coupling line 32 may be largely determined by the size, shape, and location of the coupling line 32 relative to the signal line 30 and not so much by the design of the connecting lines 34 and 36. This is expected to be true at least if each of the connecting lines 34 and 36 is connecting to the coupling line 32 at the respective pick-off point 42, 44 at a noticeable angle. For instance, the coupling line 32 and the first connecting line 34 may meet at an angle of between 45° and 145°. The coupling line 32 and the second connecting line 36 may similarly form an angle of between 35° and 135°. In the shown example, the angle is 90°.

Electromagnetic couplers usually have dimensions comparable to the wave length of the signal in question. Familiar coupling lengths include, for instance, lengths such as 2×Λ, Λ, Λ/4, and Λ/2, Λ being the wave length of the observed signal. This may be explained by the fact that such couplers usually exploit some kind of resonance or interference effect.

In contrast, studies relating to a design as described in reference to FIGS. 2 and 3 suggest that the conductive part 33 may positively affect the coupling between the signal line 30 and the coupling line 32. The coupling line 32 may therefore have a length which may be substantially shorter than the wavelength of the RF signal traveling on the signal line 30. For instance, a 77 gigahertz signal has a vacuum wavelength of 3.4 millimeters. Its wavelength on the signal line 30 may be somewhat shorter, as the propagation velocity on the signal line 30 may be somewhat slower. The wavelength on the signal line 30 may, for instance, be approximately 400 micrometers. However, a coupling length, i.e., the length of the coupling line 32, of between 25 to 50 micrometers has been found to be sufficient to induce a sufficiently clear signal in the coupling line 32. A coupling structure as shown in FIGS. 2 and 3 in which the signal line 30 and a coupling line 32 may be arranged above or below a uniform conductive surface or sandwiched between two conductive surfaces may therefore be beneficial for further miniaturization of an integrated circuit. The coupling line 32 may, for instance, have a length of not more than only 2% of the vacuum wave length of the radio frequency signal.

The signal sensor comprising the coupling line 32, the first connecting line 34, and the second connecting line 36 may have a certain directivity, i.e., one of the two connecting lines 34 and 36 may be more sensitive to a radio frequency wave traveling on the signal line 30 in a first direction (e.g., from the first end 38 to the second end 40) while the other end may be more sensitive to a radio frequency wave travelling on the signal line 30 in the opposite direction, e.g., from the second end 40 to the first end 38. In FIG. 2, for instance, the first connecting line 34 may be more sensitive to a wave travelling in the X-direction, while the second connecting line 36 may be more sensitive to a wave travelling in the reverse X-direction. The directivity of a given node on the coupling line 32, e.g., the first pick-off point 42 or the second pick-off point 44, may, for instance, be defined as the amplitude of the voltage induced by the forward wave compared to the amplitude of the voltage induced by the reverse wave. Ideally, a forward wave on the signal line 30 should induce a voltage only at the first pick-off point 42 of the coupling line 32, and a reverse wave should induce a voltage only at the second pick-off point 44. The induced voltage may be measured, for instance, between a terminal 46 of the connecting line 34 and ground 54

Figure 5:
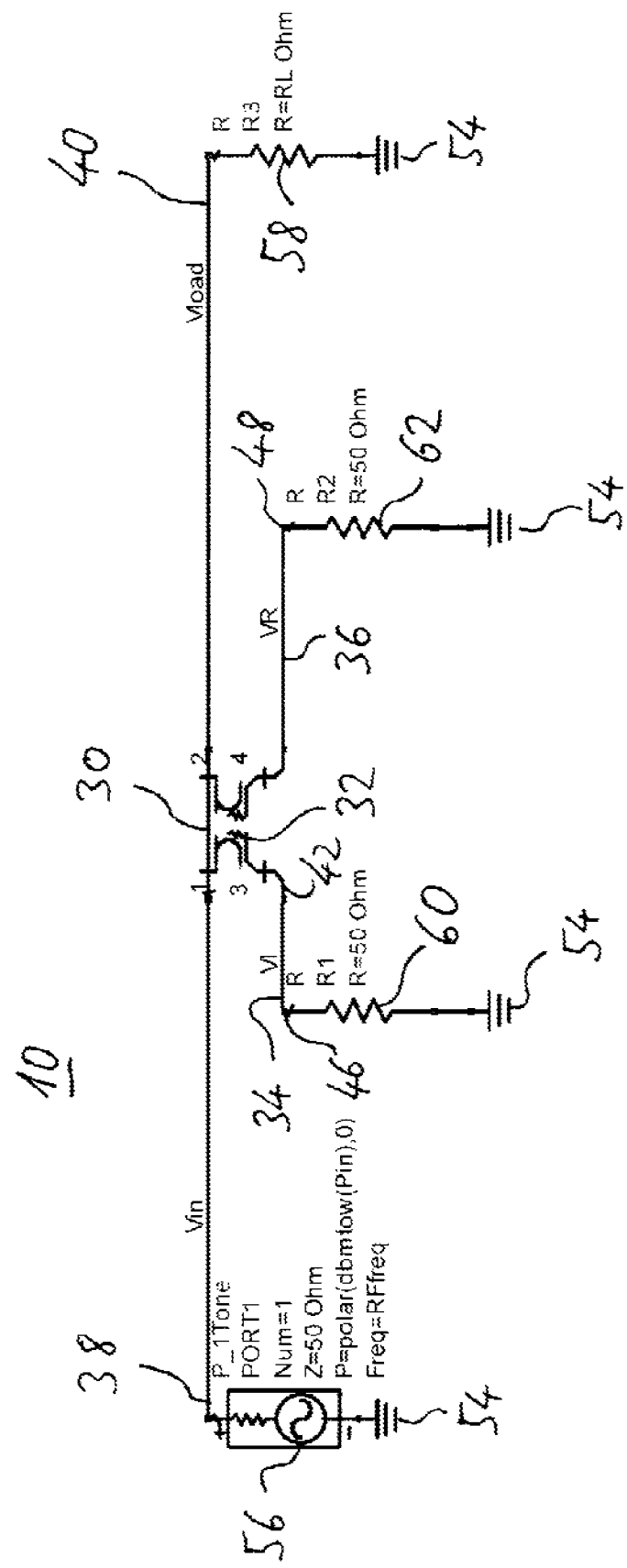
FIG. 5 schematically shows another example of an embodiment of an integrated circuit.

(see FIG. 5). A suitable length of the coupling line 32 may be determined numerically by studying the directivity for different lengths.

Figure 4:
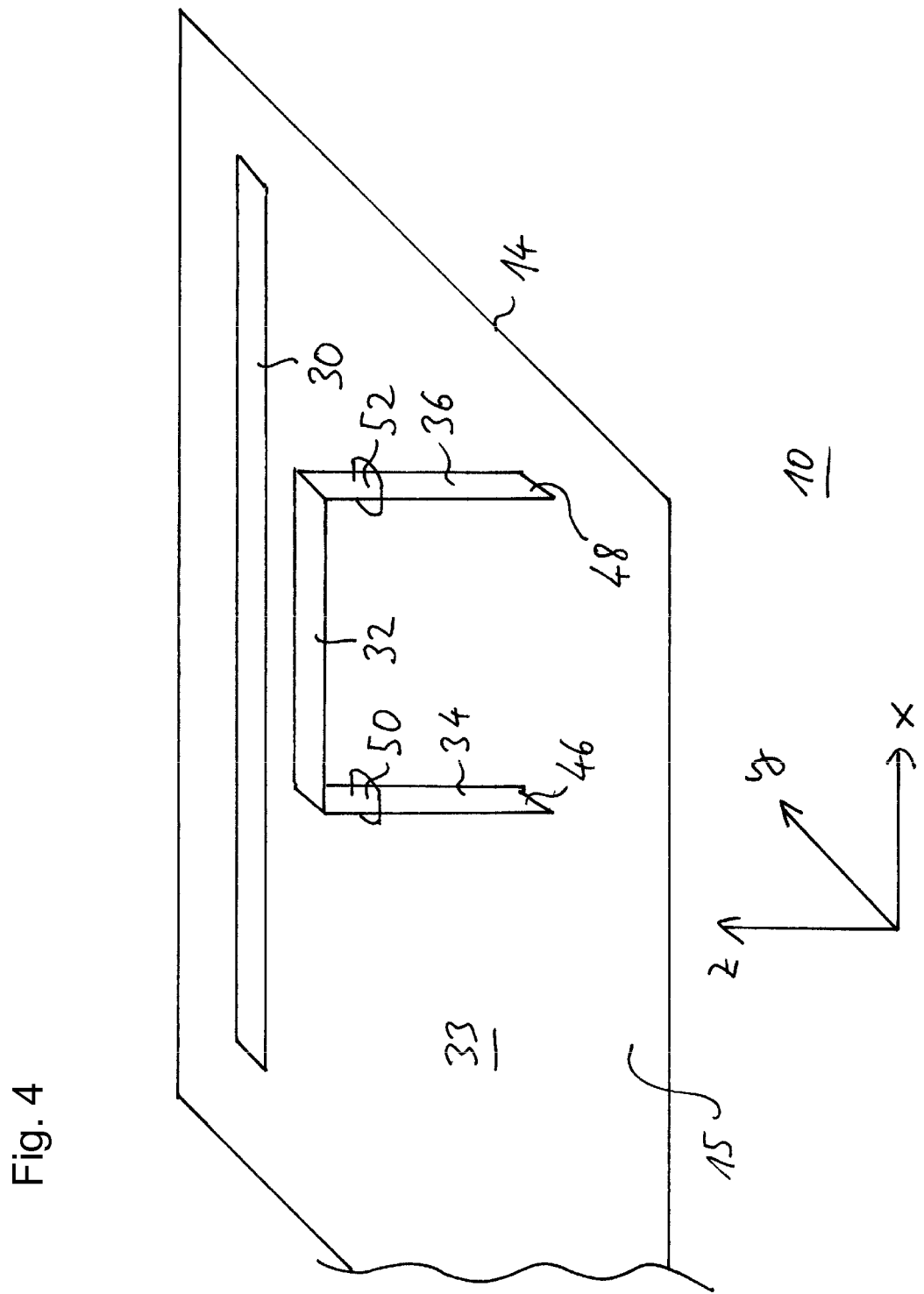
FIG. 4 schematically shows another example of an embodiment of an integrated circuit.

FIG. 4 schematically illustrates an example of a variant of the integrated circuit 10 described above in reference to FIGS. 1, 2, and 3. As mentioned above, the connecting lines 34 and 36 may be expected to have only a minor effect on the induced radio frequency signal on the coupling line 32. This may allow for a variety of options for their design. For instance, in FIG. 4, they may extend perpendicularly rather than horizontally with respect to, e.g., the surface 15 of the conductive part 33. The connecting lines 34 and 36 may, for instance, be implemented as through connections which may traverse one or more layers of the integrated circuit 10, now considering the example of a stack design. For instance, the connecting lines 34 and 36 may traverse the conductive part 33 through a first hole 50 and a second hole 52, respectively. A through connection can be expensive but offer more freedom to the circuit designer.

Although two connecting lines 34 and 36 are shown in the Figures, it may be expected that these components do not depend on each other. In another example of the integrated circuit 10, one of the two connecting lines 36 and 34 may therefore be absent. This can be useful, for instance, when the signal 30 is known to convey only, e.g., a forward wave and no reverse or reflected wave.

Another example of an integrated circuit 10 is described in reference to FIG. 5. The integrated circuit 10 shown therein may be one of the circuits described above in references to FIGS. 1 to 4. In this example, the first end 38 of the signal line 30 may be connected to an oscillator 56. The oscillator 56 may, for instance, be arranged to output a radio frequency signal having a designed frequency of, e.g., 77 gigahertz. The generated radio frequency signal may travel from the first end 38 to the second end 40. The signal may be further fed from the end 40 to a processing unit (not shown) or to, e.g., an antenna. The processing unit may be arranged within the same integrated circuit 10 or be located outside the circuit 10. A resistive element 58 may be connected between the second end 40 of the signal line 30 and, e.g., a ground terminal 54. An impedance mismatch between the second end 40 and the unit connected to it may thus be reduced in order minimize reflection of the radio frequency signal at the second end 40. Furthermore, resistors 60 and 62 may be connected between the terminals 46 and 48 of the connecting lines 34 and 36 and, e.g., the ground terminal 54, respectively. Reflections of the wave induced on the coupling line 32 may thus be minimized. An amplitude, e.g., a voltage level, of the radio frequency signal travelling in the forward direction, i.e., from end 38 to end 40, for example, may induce a corresponding oscillatory voltage level VI at the first pick-off point 42 and thus generate a wave travelling from the first pick-off point 42 on the connecting line 34 to the terminal 46. The resistive element 60 connected between the terminal 46 and, e.g., the ground terminal 54 may help to reduce reflections from the terminal 46 which might interfere with the output signal at the terminal 48 of the second connecting line 36. The resistive element 60 may thus improve sensing the reflected wave on the signal line 30. Similarly, the resistive element 62 may help to improve sensing the incident wave on the signal line 30. As mentioned above, the induced voltage VI representing the voltage Vin of the incident wave on the signal line 30 may be measured relative to the ground terminal 54. Similarly, the voltage level VR representing a voltage level of the reflected wave on the signal line 30 may be measured relative to the ground terminal 54.

An arrangement of the coupling line 32 between the signal line 30 and an additional conductive element 33 may thus allow the coupling line 32 to be considerably shorter than the wave length of the wave travelling on the signal line 30. Furthermore, the proposed design has a simple geometry and may be robust against electromagnetic signals from other regions of the integrated circuit 10. A numerical analysis of the sensor arrangement may therefore be straightforward. The coupling structure 30, 32, 33, 35 may notably be used as an on-chip power sensor. It may be integrated in a standard CMOS backend and may be extremely compact. It may also be integrated in a pad structure. Its small dimensions can make it particularly useful for 77 gigahertz radar applications, e.g., for the automotive sector.

It is noted that the coupling line 32 may be oriented differently relative to the signal line 30 or be non-straight, but the shown design in which the coupling line 32 and a corresponding coupling section of the signal line 30 are both straight and arranged atop each other was found to yield the best results in view of sensitivity and directivity. For instance, a coupling of 11 DB, a directivity of 4.1 DB, and a loss of 0.3 DB has been predicted for the circuit shown in FIG. 5.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Equivalently, these terms may be defined relative to a body-fixed coordinate system, i.e., a coordinate system fixed to the device in question, e.g., to the device 10.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit comprising:
   a signal line for carrying a radio frequency signal;
   a coupling line inductively coupled to said signal line for delivering an induced signal in dependence on said radio frequency signal;
   a connecting line connected to a pick-off point of said coupling line for picking off said induced signal from said coupling line; and
   a conductive part for shielding said coupling line against electromagnetic interference and for enhancing inductive coupling between said signal line and said coupling line;
   said conductive part having a uniform flat surface facing said coupling line,
   said signal line extending parallel to said surface,
   said coupling line extending parallel to said signal line and arranged between said surface and said signal line.

2. The integrated circuit of claim 1, with no further conductive elements arranged between said surface and said coupling line.

3. The integrated circuit of claim 1, said coupling line having a length of not more than two percent of a vacuum wavelength of said radio frequency signal.

4. The integrated circuit of claim 3, wherein said vacuum wavelength is less than one centimeter.

5. The integrated circuit of claim 1, wherein said pick-off point is an end point of said coupling line.

6. The integrated circuit of claim 1, further comprising:
   a ground node for providing a ground voltage, and
   a resistive element,
   said pick-off point connected to said ground terminal via said connecting line -and said resistive element so as to limit reflections in said connecting line and in said coupling line.

7. The integrated circuit of claim 1, comprising an output terminal for delivering said induced signal.

8. The integrated circuit of claim 1, said connecting line and said coupling line forming an angle between 45 degrees and 135 degrees at said pick-off point.

9. The integrated circuit of claim 1, wherein said coupling line is straight.

10. An integrated circuit comprising;
    a signal line for carrying a radio frequency signal,
    a coupling line inductively coupled to said signal line for delivering an induced signal in dependence on said radio frequency signal;
    a connecting line connected to a pick-off point of said coupling line for picking off said induced signal from said coupling line;
    a conductive part for shielding said coupling line against electromagnetic interference and for enhancing inductive coupling between said signal line and said coupling line, said conductive part having a uniform flat surface facing said coupling line, said signal line extending parallel to said surface, said coupling line extending parallel to said signal line and arranged between said surface and said signal line, and
    several layers stacked atop each other, said layers including, in this order:
       a first metal layer comprising said conductive part;
       a first isolating layer;
       a second metal layer comprising said coupling line;
       a second isolating layer;
       a third metal layer comprising said signal line; and
       a third isolating layer;
    with no further layers stacked between said layers.

11. The integrated circuit of claim 10, said second metal layer further comprising said connecting line.

12. The integrated circuit of claim 10, said connecting line extending from said pick-off point in a direction perpendicular to said layers.

13. The integrated circuit of claim 1, further comprising a second connecting line connected to a second pick-off point of said coupling line for picking off said induced signal at said second pick-off point.

14. The integrated circuit of claim 1, further comprising a second conductive part for shielding said coupling line against electromagnetic interference and for enhancing inductive coupling between said signal line and said coupling line; said second conductive part having a uniform flat surface facing said signal line and said surface of said first conductive part.

15. An integrated circuit comprising;
    a signal line for carrying a radio frequency signal;
    a coupling line inductively coupled to said signal line for delivering an induced signal in dependence on said radio frequency signal;
    a connecting line connected to a pick-off point of said coupling line for picking off said induced signal from said coupling line;
    a conductive part for shielding said coupling line against electromagnetic interference and for enhancing inductive coupling between said signal line and said coupling line, said conductive part having a uniform flat surface facing said coupling line, said signal line extending parallel to said surface, said coupling line extending parallel to said signal line and arranged between said surface and said signal line;
    a second conductive part for shielding said coupling line against electromagnetic interference and for enhancing inductive coupling between said signal line and said coupling line; said second conductive part having a uniform flat surface facing said signal line and said surface of said first conductive part; and
    several layers stacked atop each other, said layers including, in this order:
       a first metal layer comprising said first conductive part;
       a first isolating layer;
       a second metal layer comprising said coupling line;
       a second isolating layer;
       a third metal layer comprising said signal line;
       a third isolating layer; and
       a fourth metal layer comprising said second conductive part;
    with no further layers stacked between said layers.

16. The integrated circuit of claim 15, wherein said second isolating layer has a thickness of between 1 and 10 micrometers (μm).

17. The integrated circuit of claim 1, wherein said radio frequency signal is a 77 gigahertz (GHz) radar signal.

18. The integrated circuit of claim 1, wherein a length of the coupling line is between 25 to 50 micrometers (μm).

19. The integrated circuit of claim 13, wherein said pick-off point provides for picking off a forward wave induced signal of said induced signal and said second pick-off point provides for picking off a reverse wave induced signal of said induced signal.

20. The integrated circuit of claim 1, wherein said radio frequency signal has a vacuum wavelength of 3.4 millimeters (mm).

* * * * *